US009177913B2

(12) United States Patent
Wu et al.

(10) Patent No.: US 9,177,913 B2
(45) Date of Patent: Nov. 3, 2015

(54) SEMICONDUCTOR STRUCTURE AND FABRICATION METHOD (71) Applicant: Semiconductor Manufacturing International (Shanghai) Corporation, Shanghai (CN)

(72) Inventors: Jingang Wu, Shanghai (CN); Jianping Wang, Shanghai (CN); Jinghua Ni, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 106 days.

(21) Appl. No.: 14/022,387

(22) Filed: Sep. 10, 2013

(65) Prior Publication Data
US 2014/0117491 A1 May 1, 2014

(30) Foreign Application Priority Data
Oct. 31, 2012 (CN) .......................... 2012 1 0428527

(51) Int. Cl.
*H01L 21/336* (2006.01)
*H01L 23/525* (2006.01)
*H01L 21/762* (2006.01)

(52) U.S. Cl.
CPC ...... *H01L 23/5256* (2013.01); *H01L 21/76224* (2013.01); *H01L 2924/0002* (2013.01)

(58) Field of Classification Search
CPC ..................... H01L 23/5256; H01L 21/76224; H01L 2924/0002; H01L 2924/00
USPC .................. 438/132, 215, 281, 333, 467, 601; 257/529
See application file for complete search history.

(56) References Cited

U.S. PATENT DOCUMENTS

| | | | | |
|---|---|---|---|---|
| 2005/0285224 A1* | 12/2005 | Tsutsui | ........................ | 257/531 |
| 2006/0157819 A1 | 7/2006 | Wu | | |
| 2010/0193867 A1* | 8/2010 | Yan et al. | ...................... | 257/355 |

* cited by examiner

*Primary Examiner* — Thien F Tran
(74) *Attorney, Agent, or Firm* — Anova Law Group, PLLC (57) ABSTRACT

Various embodiments provide semiconductor structures and fabrication methods. In an exemplary method, a semiconductor substrate can contain a shallow trench isolation (STI) structure that includes a fuse region. A protective layer can be provided on the high-K dielectric layer, which is provided on the semiconductor substrate. A portion of each of the protective layer and the high-K dielectric layer can be removed from the fuse region to expose the STI structure. A fuse layer can be formed on the exposed surface of the STI structure. A portion of the fuse layer, the remaining portion of the protective layer, and a remaining portion of the high-K dielectric layer outside of the fuse region can be removed from the semiconductor substrate to form a fuse structure.

13 Claims, 6 Drawing Sheets

FIG. 1

*(Prior Art)*

FIG. 2

*(Prior Art)*

SEMICONDUCTOR STRUCTURE AND FABRICATION METHOD

CROSS-REFERENCES TO RELATED APPLICATIONS

This application claims priority to Chinese Patent Application No. CN201210428527.5, filed on Oct. 31, 2012, the entire contents of which are incorporated herein by reference.

FIELD OF THE DISCLOSURE

The present disclosure relates to the field of semiconductor fabrication technology and, more particularly, relates to semiconductor structures and fabrication methods.

BACKGROUND

With the miniaturization and increasing complexity of semiconductor technologies, semiconductor devices become more easily affected by various defects or impurities. Failure of a single metal wire, diode, or transistor often constitutes defects of an entire chip. To solve this problem, conventional solutions include use of fuses or fusible links formed in the integrated circuits (ICs) to ensure usability of the ICs.

Fuses are used to connect redundant circuits in the ICs. When defects are detected in a circuit, the fuses can be used to repair or replace the defective circuit. In addition, fuses can provide a programming function. A chip may include a circuit, a device array, and a programming circuit. With data externally inputted, the circuit design may include a programming circuit. For example, in a programmable read-only memory (PROM), an open circuit is produced by blowing open a fuse, having a logic state "1", while an unopened fuse maintains a connected state having a logic state "0".

Conventional fuse structures include a polysilicon fuse structure. The polysilicon fuse structure is usually simultaneously formed when forming a transistor having a high-K gate dielectric layer and a metal gate layer formed by a gate last process. In the gate last process, a dummy gate structure is formed on a semiconductor substrate. The dummy gate structure includes a high-K dielectric layer, a protective layer on the high-K dielectric-layer, and a polysilicon layer on the protective layer. A metal layer is then used to replace the polysilicon layer to form the gate structure of the transistor.

Figure 1:
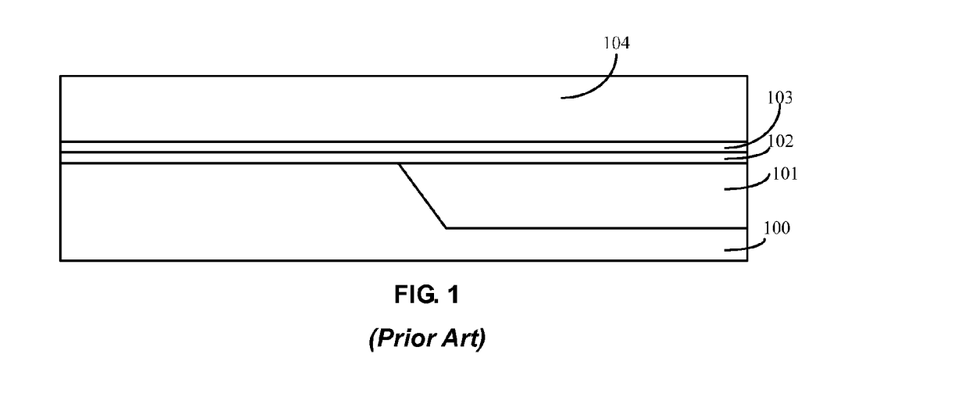
FIGS. 1-2 depict formation of a conventional semiconductor structure.
Figure 2:
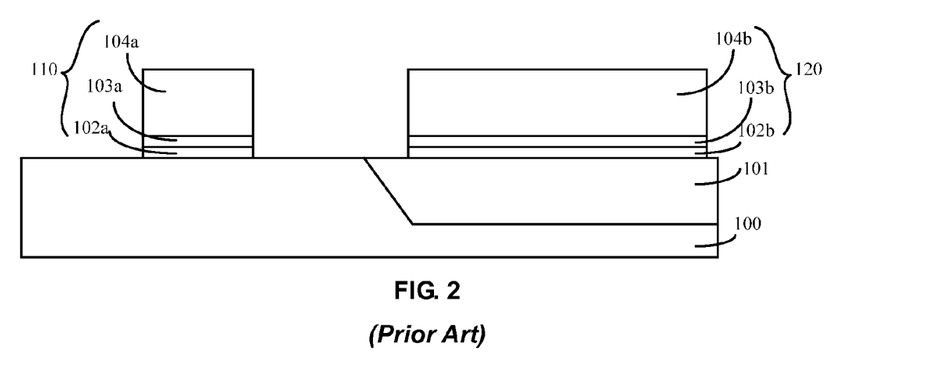

During the gate last process, when the dummy gate structure is formed on the semiconductor substrate, the polysilicon fuse structure is formed on a shallow trench isolation (STI) structure. FIGS. 1-2 depict formation of a conventional semiconductor structure.

In FIG. 1, a semiconductor substrate 100 is provided including a STI structure 101 formed therein. A high-K dielectric layer 102 is formed on the semiconductor substrate 100 and on an STI structure 101. A protective layer 103 is formed on the high-K dielectric layer 102. A polysilicon layer 104 is formed on the protective layer 103.

In FIG. 2, a portion of each of the polysilicon layer 104, the protective layer 103, and the high-K dielectric layer 102 is removed from the semiconductor substrate 100 and from the shallow trench isolation structure 101 by an etching process. A dummy gate structure 110 is thus formed on the semiconductor substrate 100, and a fuse structure 120 is formed on the shallow trench isolation structure 101.

The dummy gate structure 110 includes: a high-K dielectric layer 102a, a protective layer 103a on the high-K dielectric layer 102a, and a polysilicon layer 104a on the protective layer 103a. The fuse structure 120 includes: a high-K dielectric layer 102b, a protective layer 103b on the high-K dielectric layer 102b, and a polysilicon layer 104b on the protective layer 103b. After the dummy gate structure 110 is formed, the polysilicon layer 104a of the dummy gate structure 110 is removed from the protective layer 103a. A metal gate layer is then formed on the protective layer 103a to form a gate structure of the transistor.

Problems arise, however, because the fuse structure formed on the protective layer and the high-K dielectric layer provides unstable device performance.

BRIEF SUMMARY OF THE DISCLOSURE

According to various embodiments, there is provided a method for forming a semiconductor structure. A semiconductor substrate can be provided including a shallow trench isolation (STI) structure formed therein. The STI structure can include a fuse region. A high-K dielectric layer can be provided on the semiconductor substrate including the STI structure. A protective layer can be provided on the high-K dielectric layer. A portion of each of the protective layer and the high-K dielectric layer can be removed from the fuse region to expose a first surface portion of the STI structure in the fuse region. A fuse layer can be formed on each surface of a remaining portion of the protective layer and the exposed first surface portion of the STI structure. A portion of the fuse layer, the remaining portion of the protective layer, and a remaining portion of the high-K dielectric layer can be removed from the semiconductor substrate to expose a second surface portion of the STI structure outside of the fuse region. A fuse structure can be formed.

According to various embodiments, there is also provided a semiconductor structure. The semiconductor structure can include a semiconductor substrate including a shallow trench isolation (STI) structure formed therein. The STI structure can include a fuse region. A high-K dielectric layer can be disposed on the semiconductor substrate outside of the fuse region. A protective layer can be disposed on the high-K dielectric layer. A fuse structure can include a fuse layer disposed on the STI structure in the fuse region and in direct contact with a surface of the STI structure.

As disclosed herein, a protective layer can be formed on a high-K dielectric layer. The high-K dielectric layer can be formed on a semiconductor substrate containing an STI structure. A portion of each of the high-K dielectric layer and the protective layer in a fuse region can be removed to expose a first surface portion of the STI structure. A fuse layer can be formed on each surface of the remaining protective layer, the STI structure, and the semiconductor substrate (for example, which may also be used to form a transistor). The fuse layer in the fuse region can be formed directly on surface of the STI structure. When portions of each of the fuse layer, the high-K dielectric layer, and the protective layer outside of the fuse region are subsequently removed, a fuse structure can be formed in direct contact with the STI structure. Thus, electric current can be prevented from occurring between the fuse structure and the STI structure. High voltages applied to blow open the fuse structure are then able to be entirely applied to the fuse structure. Therefore, desired blowing effect of the fuse structure can be obtained. Device performance of the formed fuse structure can be stable.

Further, a first patterned photoresist layer can be used as an etch mask to remove a portion of each of the high-K dielectric layer and the protective layer from the fuse region. A second patterned photoresist layer can be used as an etch mask to remove portions of the fuse layer, the high-K dielectric layer, and the protective layer outside of the fuse region. Because the surface area covered by the first patterned photoresist layer and the surface area exposed by the second patterned photoresist layer are the same, reversed photoresist materials can be used for the first patterned photoresist layer and the second patterned photoresist layer. A same photo mask can be used for the exposure processes to form the first patterned photoresist layer and the second patterned photoresist layer. There is no need to use a second photo mask. Manufacturing process can be simplified and manufacturing cost can be saved.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A fuse structure formed with a dummy gate structure of a transistor (e.g., having a high-K gate dielectric layer) may have unstable device performance. For example, referring to FIGS. 1-2, in order to form a transistor including a high-K gate dielectric layer 102a and a metal gate layer (not shown), a dummy gate structure 110 needs to be formed first. The dummy gate structure 110 includes the high-K dielectric layer 102a, a protective layer 103a formed on the high-K dielectric layer 102a, and a polysilicon layer 104a formed on the protective layer 103a.

The protective layer 103a is used to protect the underlying high-K dielectric layer 102a and/or the metal gate layer formed thereon. The protective layer 103a can be used to protect the high-K dielectric layer 102a when subsequently forming the metal gate layer on the protective layer 103a. Specifically, the protective layer 103a can prevent metal atoms from diffusing from the metal gate layer into the high-K dielectric layer 102a. Further, the protective layer 103a can prevent process-generated impurities from entering into the subsequently-formed metal gate layer through the high-K dielectric layer 102a. In addition, the protective layer 103a can protect the high-K dielectric layer 102a from being damaged when removing the dummy gate layer, i.e., the polysilicon layer 104a. The protective layer 103a is often made of titanium nitride or tantalum nitride, which is electrically conductive.

A fuse structure 120 formed with the dummy gate structure of the transistor includes a high-K dielectric layer 102b, a protective layer 103b disposed on the high-K dielectric layer 102b, and a polysilicon layer 104b disposed on the protective layer 103b as shown in FIG. 2. Because the protective layer 103b is conductive, electrical conduction may occur between the polysilicon layer 104b and the STI structure 101 during operation of the fuse structure 120. Further, voltages applied to blow open the fuse structure 120 are high voltages. However, under these high voltages, some electric charges can pass through the high-K dielectric layer 102b.

Therefore, when the high voltages are applied to the two ends of the polysilicon layer 104b in the fuse structure 120 to blow open the polysilicon layer 104b, the applied voltages are not completely used for blowing open the polysilicon layer 104b and may be further used in an additional conduction path due to the conductivity of the protective layer 103b (and/or sometimes the gate dielectric layer). Consequently, unstable operation performance of the fuse structure may be generated.

As disclosed herein, after a high-K dielectric layer and a protective layer are formed on a semiconductor substrate containing shallow trench isolation (STI) structure therein, the protective layer and the high-K dielectric layer can be removed from a fuse region for forming a fuse structure. The subsequently-formed fuse structure, e.g., formed by polysilicon, can be in direct contact with the shallow trench isolation structure. In the case when the fuse structure is blown open, the fuse structure can avoid the problems that the applied high voltages are not completely used for blowing open the fuse structure. The disclosed semiconductor structures and methods can thus ensure the blowing effect of the fuse structure. Stable operation performance can be obtained for the fuse structure.

Figure 11:
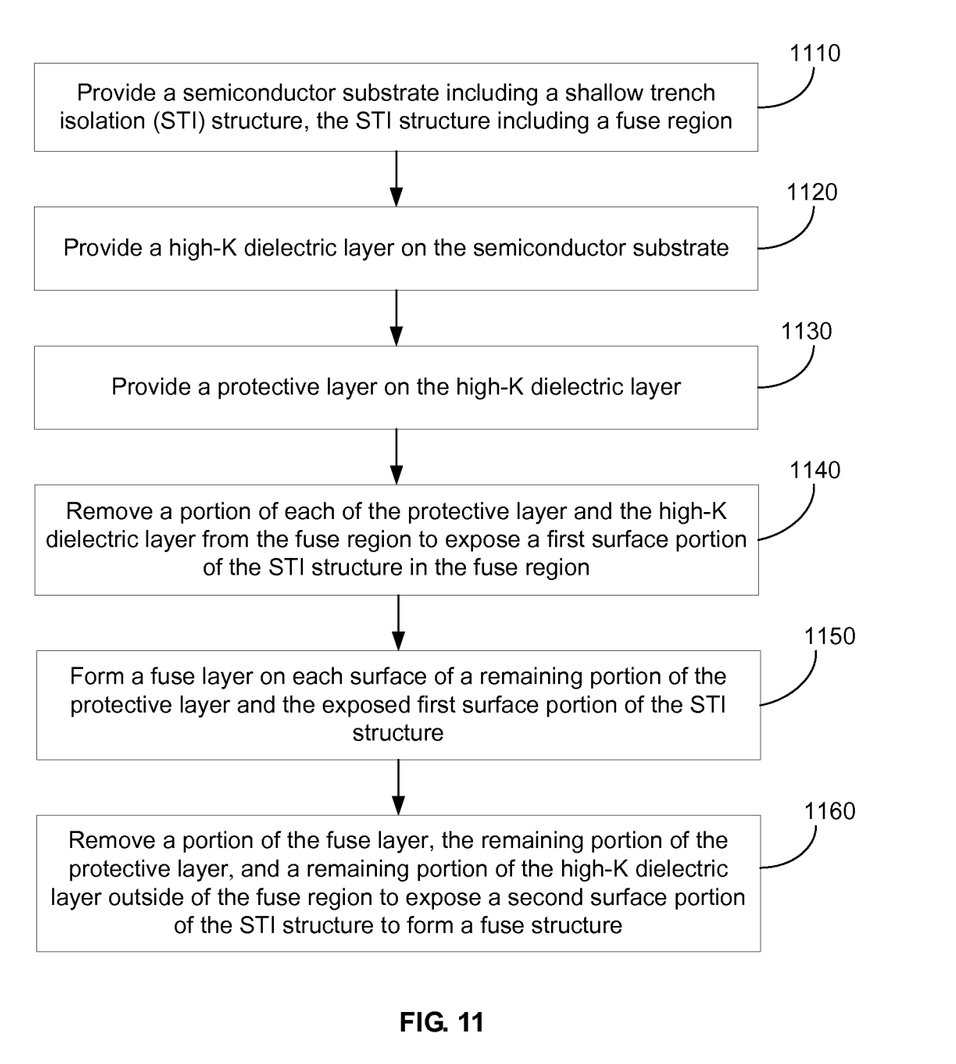
FIGS. 11-12 depict exemplary methods for forming a semiconductor structure in accordance with various disclosed embodiments.
Figure 12:
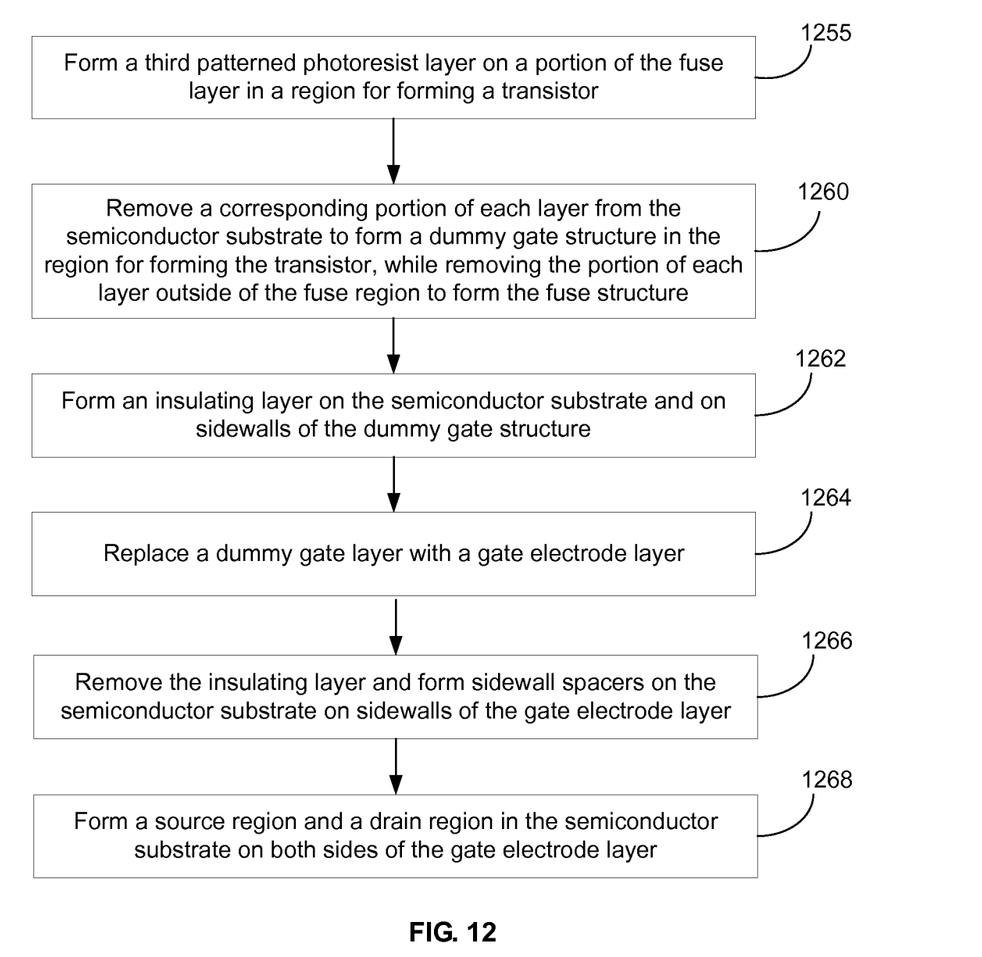

FIGS. 3-9 depict cross-sectional views of an exemplary semiconductor structure at various stages during its formation, while FIGS. 11-12 depict exemplary methods for forming a semiconductor structure in accordance with various disclosed embodiments. For example, the structures are described corresponding to the methods, the structures and the methods are not limited to each other in any manner.

Figure 3:
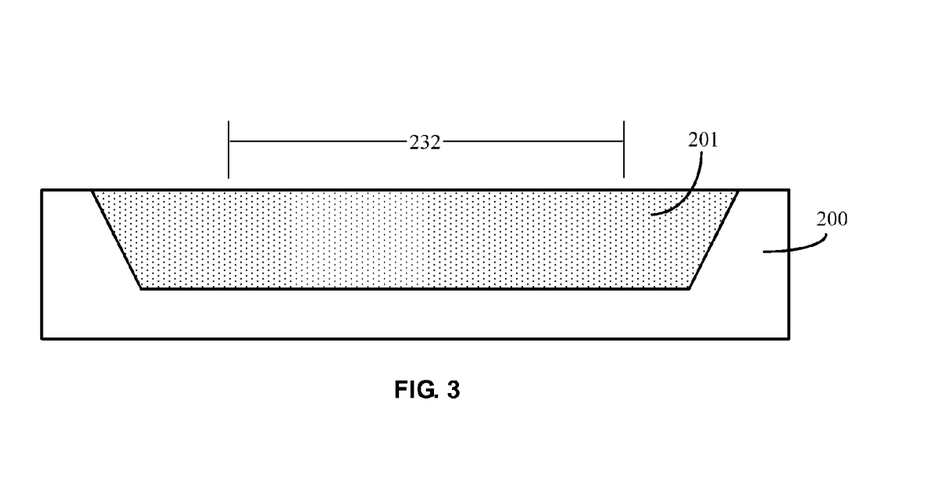
FIGS. 3-9 depict cross-sectional views of an exemplary semiconductor structure at various stages during its formation in accordance with various disclosed embodiments.

In Step 1110 of FIG. 11 and referring to FIG. 3, a semiconductor substrate 200 is provided. The semiconductor substrate 200 can contain an isolation structure, e.g., a shallow trench isolation (STI) structure 201. The STI structure 201 can include a fuse region 232.

The semiconductor substrate 200 can be used to provide a working platform for subsequent processes. For example, the material of the semiconductor substrate 200 can be silicon, silicon-germanium, silicon carbide, silicon-on-insulator, silicon nitride, and/or Group III-V compounds (e.g., gallium arsenide, etc.).

The STI structure 201 can be made of a material including, e.g., silicon oxide. A fuse structure can be subsequently formed on a surface of the STI structure 201, e.g., in the fuse region 232. The fuse region 232 in the STI structure 201 defines a corresponding position of the fuse structure to be subsequently formed on the STI structure 201.

The semiconductor substrate 200 can have a portion outside of the STI structure 201 and used to form a transistor. The transistor can include, for example, a PMOS transistor, a NMOS transistor, and/or a CMOS transistor. The fuse structure can be formed during a formation process of the transistor. For example, when the transistor includes a metal gate structure, a fuse structure can be formed simultaneously when forming a dummy gate structure of the transistor. The dummy gate structure can include a dummy gate layer, a protective layer, and a high-K dielectric layer.

Figure 4:
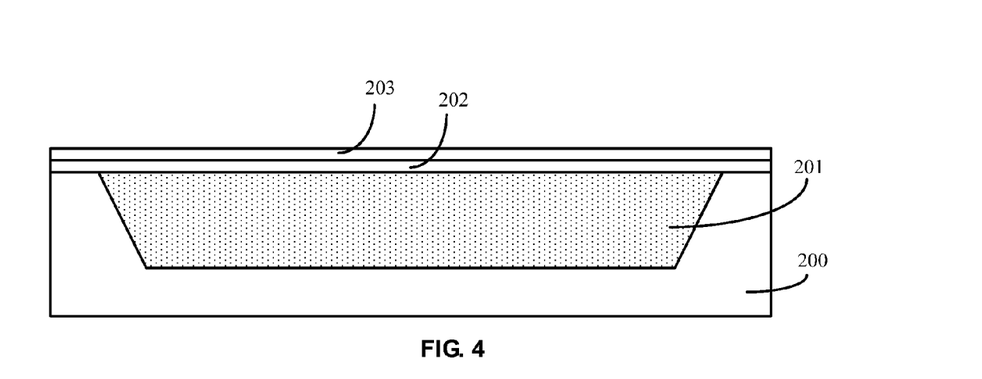

Referring to FIG. 4, a high-K dielectric layer 202 is formed on the semiconductor substrate 200 containing the STI structure 201 (e.g., in Step 1120 of FIG. 11). A protective layer 203 is formed on the high-K dielectric layer 202 (e.g., in Step 1130 of FIG. 11).

The high-K dielectric layer 202 can be formed by a process including, e.g., a chemical vapor deposition process or a physical vapor deposition process. In one embodiment, a chemical vapor deposition process can be used to form the high-K dielectric layer 202. The high-K dielectric layer 202 on the semiconductor substrate 200 can be used to form a gate dielectric layer of the transistor to be formed on the semiconductor substrate 200 in subsequent processes. The high-K dielectric layer 202 can be made of a high-K dielectric material including, for example, hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide and/or aluminum oxide. The high-K dielectric material used can reduce thickness of the gate dielectric layer yet with improved isolation effect. The high-K dielectric material can be suitable for the ICs having small sizes.

The protective layer 203 can be formed by a process including, e.g., a chemical vapor deposition process or a physical vapor deposition process. In one embodiment, the protective layer 203 can be formed by the chemical vapor deposition process. The protective layer 203 can be formed on the high-K dielectric layer 202. The protective layer 203 formed over the semiconductor substrate 200 can be a part of a gate structure of the subsequently-formed transistor. The protective layer 203 can protect the underlying surface of the high-K dielectric layer 202 from being damaged during subsequent processes, e.g., when removing the dummy gate layer. In addition, in a thermal annealing process to activate source/drain regions, the protective layer 203 over the semiconductor substrate 200 can prevent a gate electrode layer from being contaminated by gas(es) released from the gate dielectric layer of the transistor to be formed. The protective layer 203 can be made of a material including, e.g., titanium nitride, tantalum nitride, or a combination thereof.

In one case when a fuse layer is formed on the protective layer 203 in a subsequent process, between the fuse layer and the STI structure may include the protective layer 203 and high-K dielectric layer 202 that are possibly electrical conductive. Therefore, when high voltages are applied to blow open the fuse structure, the high voltages may also be applied to the high-K dielectric layer 202 and/or the protective layer 203 to generate electric current. The blowing effect of the formed fuse structure is then affected, and the device performance of the fuse structure may be unstable.

As disclosed herein, to prevent generation of electric current in the addition conduction path between the fuse layer and the STI structure and to improve device performance of the fuse structure to be formed, the high-K dielectric layer 202 and the protective layer 203 can be removed prior to forming the fuse layer. That is, the fuse layer can be formed directly on the STI structure 201, and thus can provide the formed semiconductor structure with stable performance.

Figure 5:
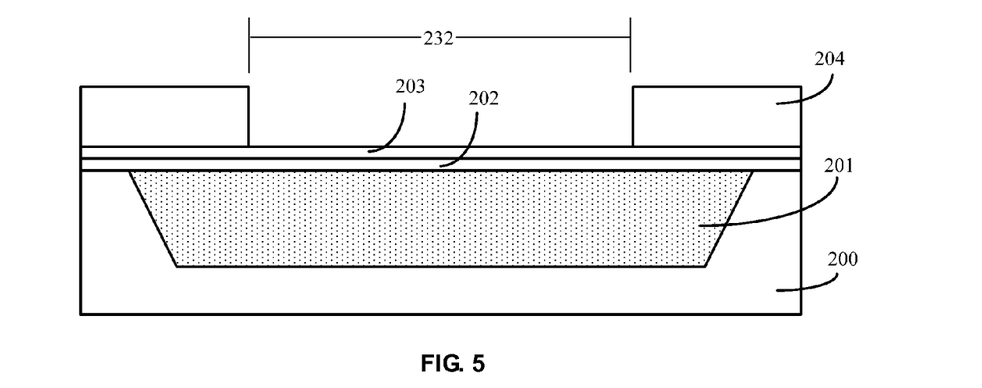

In Step 1140 of FIG. 11 and referring to FIG. 5, a first patterned photoresist layer 204 is formed on the protective layer 203. The first patterned photoresist layer 204 can expose a surface portion of the protective layer 203 corresponding to the fuse region 232 in the STI structure 201.

The first patterned photoresist layer 204 can be formed by first spin-coating a photoresist material on the protective layer 203. The photoresist material can be a positive photoresist material or a negative photoresist material. A photo mask (not shown) can be used in an exposure process of the photoresist material coated on the protective layer 203. Such photoresist material can then be baked and hardened to form the first patterned photoresist layer 204 to expose the surface portion of the protective layer 203 in the fuse region 232.

In various embodiments, the region covered by the first patterned photoresist layer 204 in FIG. 5 can be the same as the region exposed by a second patterned photoresist layer (e.g., 206 in FIG. 8) that is subsequently-formed. In one embodiment, the first patterned photoresist layer 204 and the second patterned photoresist layer can use different types of photoresist materials, e.g., one uses a positive photoresist material and the other uses a negative photoresist material. In this case, a same photo mask may be used in the exposure processes to respectively form the first patterned photoresist layer 204 and the second patterned photoresist layer. The region exposed by the first patterned photoresist layer 204 can be the same as the region covered by the second patterned photoresist layer. As a result, there is no need to use a second photo mask for forming the second patterned photoresist layer. The process flow can then be simplified, and the manufacturing cost can be reduced.

Figure 6:
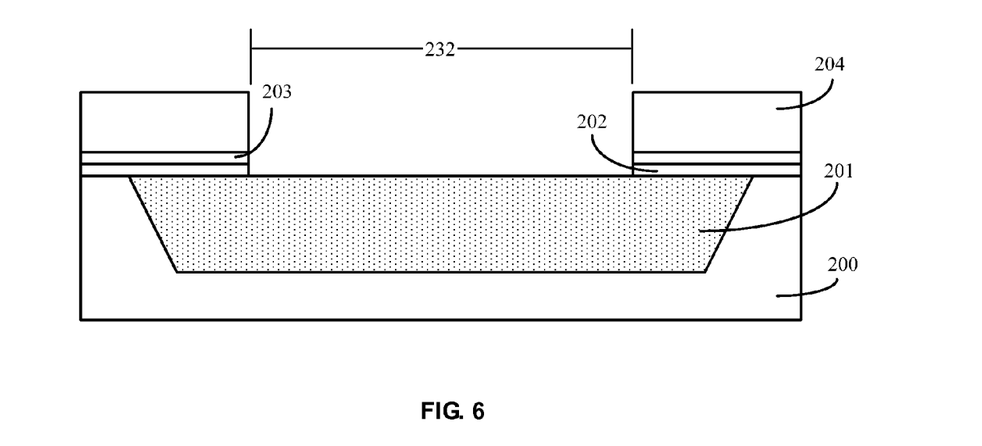

Still in Step 1140 of FIG. 11 and referring to FIG. 6, the first patterned photoresist layer 204 is used as an etch mask to etch the protective layer 203 and the high-K dielectric layer 202 until the STI structure 201 is exposed.

Each of the protective layer 203 and the high-K dielectric layer 202 can be etched by, for example, a dry etch and/or a wet etch. For example, the dry etch can be an anisotropic dry etch, and the wet etch can be an isotropic wet etch.

The first patterned photoresist layer 204 can expose a surface portion of the protective layer 203 in the fuse region 232. A portion of each of the protective layer 203 and the high-K dielectric layer 202 can be removed from the fuse region 232 by the etching process to expose a first surface portion of the STI structure 201. The fuse layer can then be formed directly on the exposed first surface portion of the STI structure 201 in the fuse region 232. That is, the subsequently-formed fuse layer can be in direct contact with the surface of the STI structure 201. In an operation to blow open the fuse structure to be formed, no electric leakage can be generated between the fuse layer and the STI structure 201. Device performance of the fuse structure can be stable.

Figure 7:
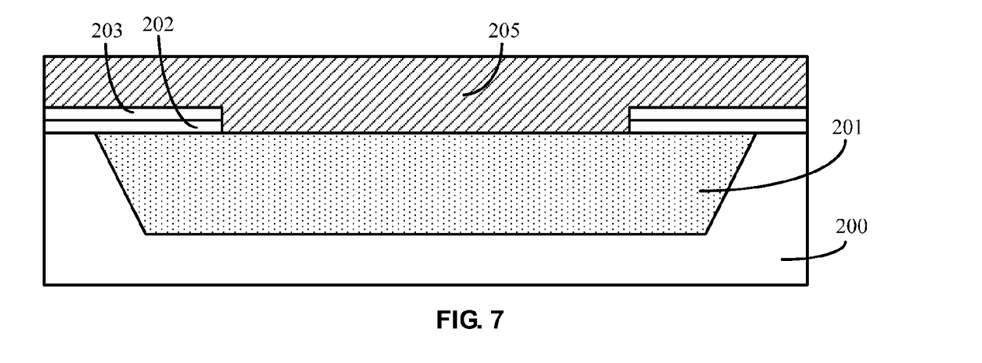

In Step 1150 of FIG. 11 and referring to FIG. 7, the first patterned photoresist layer 204 is removed from the structure shown in FIG. 6 and a fuse layer 205 is formed on a remaining portion of the protective layer 203 and on the STI structure 201 in the fuse region 232.

The fuse layer 205 can be made of a material including, for example, polycrystalline silicon, polycrystalline germanium, or any other suitable materials. The formation process of the fuse layer 205 can include a chemical vapor deposition process or a physical vapor deposition process. The fuse layer 205, formed on the protective layer 203 and on the semiconductor substrate 200, can be used to form the dummy gate layer in subsequent processes in a region for forming the transistor, in addition to subsequently forming the fuse structure.

The fuse layer 205 can have an electrical resistance such that the electrical resistance can cause the subsequently-formed fuse structure to generate heat in response to a certain voltage applied to the formed fuse structure. The fuse structure can include a blowing region having a width that is sufficiently narrow for an easy blow-open. In one embodiment, the fuse layer 205 can include polycrystalline silicon or polycrystalline germanium and can be doped with p-type ions or n-type ions to increase electrical resistance of the resultant fuse layer. The subsequently-formed fuse structure can then be more stable. The p-type ions can include, for example, boron ions and/or indium ions. The n-type ions can include, for example, phosphor ions and/or arsenic ions. Process for doping ions in the fuse layer 205 can include, for example, an ion implantation process or an in-situ doping process.

Figure 8:
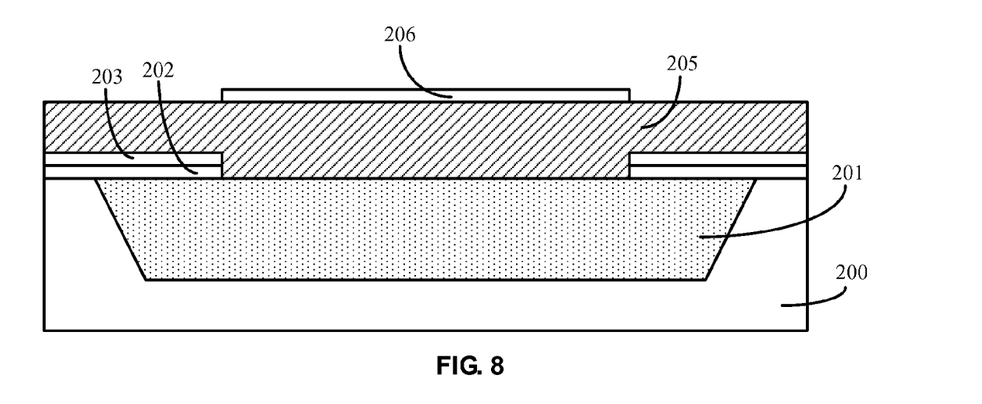

In Step 1160 of FIG. 11 and referring to FIG. 8, a second patterned photoresist layer 206 is formed on the fuse layer 205. The second patterned photoresist layer 206 can expose a surface portion of the fuse layer 205 that is outside of the fuse region 232. The second patterned photoresist layer 206 can be formed using a same process for forming the first patterned photoresist layer 204 (as shown in FIG. 5).

The photoresist materials used for the first patterned photoresist layer 204 and the second patterned photoresist layer 206 can be different types and can respond to an exposure process in an opposite or reversed manner. For example, when the first patterned photoresist layer 204 uses a positive photoresist material, the second patterned photoresist layer 206 can use a negative photoresist material. Alternatively, when the first patterned photoresist layer 204 uses a negative photoresist material, the second patterned photoresist layer 206 can use a positive photoresist material.

Additionally, a same photo mask can be used in the exposure processes of the first patterned photoresist layer 204 and the second patterned photoresist layer 206. In this case, one photo mask is used sufficiently for fabricating the disclosed semiconductor structure. This simplifies the manufacturing process and saves the manufacturing cost.

As described above, the second patterned photoresist layer 206 can be formed over the STI structure 201 to cover the surface portion corresponding to the fuse region 232, while the first patterned photoresist layer 204 can expose the surface portion corresponding to the fuse region 232. Therefore, patterns in the first patterned photoresist layer 204 and the second patterned photoresist layer 206 can be reversed or complementary. Positive photoresist materials can be used for one of the first and second patterned photoresist layers 204 and 206, while negative photoresist materials can be used for the other of the first and second patterned photoresist layers 204 and 206. The same photo mask can be used to form the first and second patterned photoresist layers 204 and 206.

In an exemplary embodiment, the transistor can be simultaneously formed when forming the fuse structure. For example, in addition to forming the second patterned photoresist layer 206 to cover the fuse region 232 of the STI structure 201, a third patterned photoresist layer can be formed on a surface portion of the fuser layer 205 over the semiconductor substrate 200 for forming a dummy gate layer of a transistor. The formation process of the third patterned photoresist layer can be the same as that for the first patterned photoresist layer 204. After a subsequent etching process, the fuse structure can be formed and the dummy gate layer of the transistor can be formed at the same time.

Figure 9:
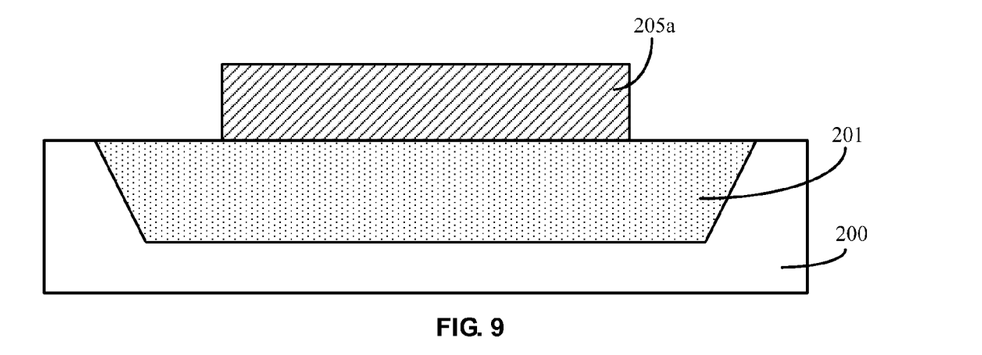

Still in Step 1160 of FIG. 11 and referring to FIG. 9, the second patterned photoresist layer 206 is used as an etch mask to etch the structure depicted in FIG. 8 (e.g., including the fuse layer 205, the protective layer 203, and the high-K dielectric layer 202). The high-K dielectric layer 202 and the protective layer 203, and portion(s) of the fuse layer 205 that are outside of the fuse region 232 can be removed from the semiconductor substrate 200 to leave a remaining portion of the fuse layer 205a used as a fuse structure formed on surface of the STI structure 201 in the fuse region 232 and to expose the semiconductor substrate 200 including a second surface portion of the STI structure 201 outside of the fuse region 232.

The fuse layer 205, the protective layer 203, and the high-K dielectric layer 202 can be etched, e.g., by a dry etch or a wet etch. In various embodiments, the dry etch can be an anisotropic dry etch, and the wet etch can be an isotropic wet etch. Optionally, after corresponding etching process(es) are completed, the second patterned photoresist layer 206 and/or the third patterned photoresist layer used for forming the transistor can be removed.

The second patterned photoresist layer 206 can cover the surface portion of the fuse layer 205 in the fuse region 232. After the etching process, the fuse structure 205a can be formed on the first surface portion of the STI structure 201 in fuse region 232 and can expose the second surface portion of the STI structure 201 outside of the fuse region 232. The material of the fuse structure 205a can be polycrystalline silicon, polycrystalline germanium, or any other suitable materials. In one embodiment, the polycrystalline silicon or polycrystalline germanium can be doped with p-type ions or n-type ions to increase electrical resistance of the fuse structure 205a and to improve stability of the fuse structure 205a. In addition, the fuse structure 205a can be formed directly on surface of the STI structure 201. Electric leakage can be prevented between the fuse structure 205a and the STI structure 201. Device performance of the fuse structure 205a can be improved.

In various embodiments, in addition to forming fuse structures/devices on the semiconductor substrate 200, various other semiconductor devices can be formed on the semiconductor substrate 200. Exemplary semiconductor devices can include transistors, formed by incorporating with the formation of the disclosed fuse structures/devices. For example, a transistor may be formed on the semiconductor substrate 200 in a region for forming the transistor. Such region for forming the transistor can also include the high-K dielectric layer 202 formed on the semiconductor substrate 200 and the protective layer 203 formed on the high-K dielectric layer 202, as similarly shown in FIG. 4.

FIG. 12 depicts an exemplary method for optionally forming a transistor on a same semiconductor substrate (e.g., as shown in FIG. 4) as for forming the disclosed fuse structure. The formation of the transistor can be incorporated with the formation of the fuse structure.

For example, a third patterned photoresist layer can be formed on a portion of the fuse layer 205 in the region for forming a transistor (e.g., in Step 1255 of FIG. 12). The third patterned photoresist layer can be used as an etch mask to etch and remove a corresponding portion of each layer on the semiconductor substrate to form a dummy gate structure in the region for forming the transistor (e.g., in Step 1260 of FIG. 12). This can be performed while simultaneously removing the portion of each layer on the semiconductor substrate 200 outside of the fuse region 232 to form the fuse structure 205a. After the etching process, the dummy gate structure can include a gate dielectric layer, a covering layer, and a dummy gate layer formed on the semiconductor substrate 200. The gate dielectric layer can be formed by etching the high-K dielectric layer 202. The covering layer can be formed by etching the protective layer 203. The dummy gate layer can be formed by etching the fuse layer 205.

When the fuse structure 205a and the transistor are formed simultaneously, manufacturing process steps can be reduced. After the dummy gate structure is formed, an insulating (or dielectric) layer can be formed on the semiconductor substrate 200 and on both sides of the dummy gate structure (e.g., in Step 1262 of FIG. 12). The dummy gate layer of the dummy gate structure can then be removed to form an opening surrounded by the insulating layer and the semiconductor substrate. The opening can be filled with a metal to form a gate electrode layer (e.g., in Step 1264 of FIG. 12). After the gate electrode layer is formed, the insulating layer can be removed. Sidewall spacers can be formed on the sidewalls of the gate electrode layer (or the gate structure) and on the surface of the semiconductor substrate 200 (e.g., in Step 1266 of FIG. 12). Source/drain regions can be formed in the semiconductor substrate 200 on both sides of the gate electrode layer or the sidewall spacers (e.g., in Step 1268 of FIG. 12). The transistor including the high-K gate dielectric layer and the metal gate electrode layer can then be formed. The transistor can be, for example, a PMOS transistor, an NMOS transistor, and/or a CMOS transistor.

Figure 10:
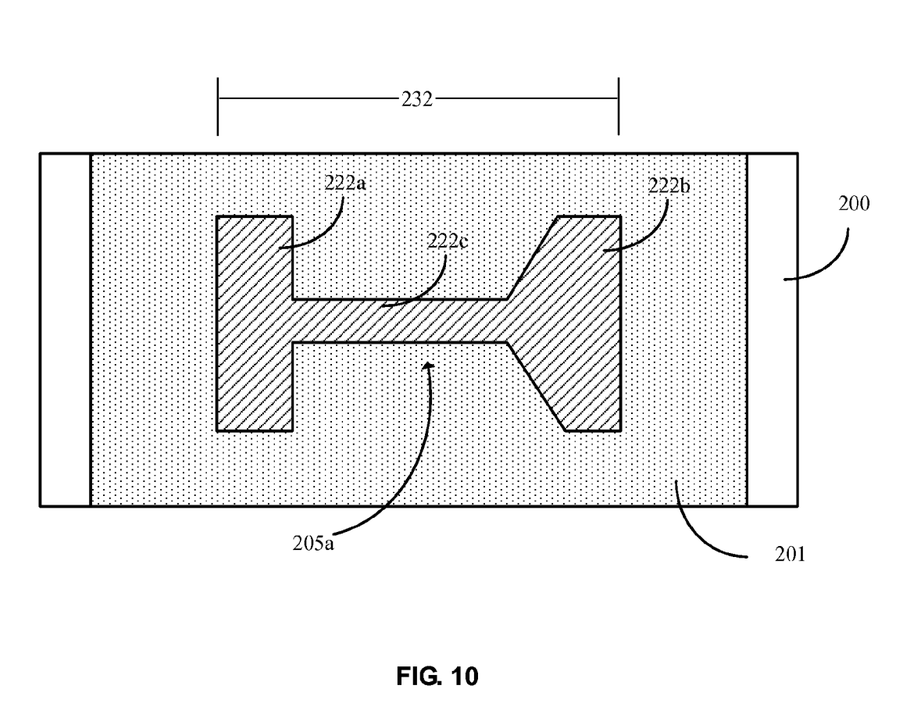
FIG. 10 depicts a top view of an exemplary fuse structure shown in FIG. 9 in accordance with various disclosed embodiments.

FIG. 10 depicts top view of the exemplary fuse structure shown in FIG. 9 in accordance with various disclosed embodiments. As shown, an exemplary fuse structure can be the fuse structure 205*a* formed on the STI structure 201. The fuse structure 205*a* can include a cathode 222*a* at one end and an anode 222*b* at another end of the fuse structure 205*a*. Between the cathode and the anode, the fuse structure 205*a* can include a blowing area 222*c*. The blowing area 222*c* can include a width less than the cathode 222*a* (and/or the anode 222*b*). The blowing area 222*c* having narrower width can be easily opened when the fuse structure 205*a* is blown open.

In various embodiments, the cathode 222*a* and the anode 222*b* can have different shapes for electrical connections. For example, as shown in FIG. 10, the cathode 222*a* can have a rectangle shape connecting to one end of the blowing area 222*c*, while the anode 222*b* can have a trapezoid shape connecting to the other end of the blowing area 222*c*.

After formation of the fuse structure 205*a* is completed, a plurality of conductive plugs can be formed on surface of each of the cathode 222*a* and the anode 222*b*. The conductive plugs can be made of a material including, e.g., copper, tungsten, aluminum, or a combination thereof. The conductive plugs can be used to apply a bias voltage to the cathode 222*a* and/or the anode 222*b* to blow-open the fuse structure 205*a*.

In one certain embodiment, an exemplary semiconductor structure can include removal of a high-k dielectric material and a protective layer (e.g., a TiN layer) for providing a poly electrical fuse (e-fuse) function in a 28 nm HK (i.e., high-k) first gate-last process. A poly e-fuse device can be formed with reliable performance and can be compatible with the HK first gate-last process flow. During an exemplary process, the high-k dielectric layer and the protective layer can be selectively removed from the semiconductor substrate (e.g., a wafer), before a fuse layer (e.g., an amorphous or polysilicon film) is deposited on surface of the wafer. The fuse resistance can be maintained sufficiently high and the e-fuse function can be more reliable without having an additional conductive current path between the fuse structure and the semiconductor substrate. For example, the electrical resistance after programming can be determined solely by a silicide (i.e., self-aligned silicide) poly film.

Note that the high-K dielectric layer and the protective layer in the fuse region are removed before the fuse layer is formed. The formed fuse layer can be in direct contact with the STI structure. Leakage current can be prevented between the fuse structure and the STI structure during the blowing process of the fuse structure. Device performance of the formed fuse structure can be maintained stable.

The fuse structure can be formed simultaneously when forming the dummy gate structure of the transistor. Manufacturing process steps can be simplified. On the other hand, the first patterned photoresist layer can be made of a positive photoresist (or in another case a negative photoresist), while the second patterned photoresist layer can be made of a negative photoresist (or in another case a positive photoresist). A same photo mask can be used for the exposure processes for forming the first and second patterned photoresist layers. Manufacturing cost can be saved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor structure, comprising:
    providing a semiconductor substrate including a shallow trench isolation (STI) structure formed therein, the STI structure including a fuse region;
    providing a high-K dielectric layer on the semiconductor substrate including the STI structure;
    providing a protective layer on the high-K dielectric layer;
    forming a first patterned photoresist layer on the protective layer, wherein the first patterned photoresist layer exposes a surface portion of the protective layer in the fuse region;
    using the first patterned photoresist layer as an etch mask to etch each of the protective layer and the high-K dielectric layer until a first surface portion of the STI structure in the fuse region is exposed;
    forming a fuse layer on each surface of a remaining portion of the protective layer and the exposed first surface portion of the STI structure; and
    removing a portion of the fuse layer, the remaining portion of the protective layer, and a remaining portion of the high-K dielectric layer from the semiconductor substrate to expose a second surface portion of the STI structure outside of the fuse region to form a fuse structure.

2. The method of claim 1, wherein the removing of the portion of the fuse layer, the remaining portion of the protective layer, and the remaining portion of the high-K dielectric layer to expose the second surface portion of the STI structure outside of the fuse region includes:
    forming a second patterned photoresist layer on the fuse layer, wherein the second patterned photoresist layer exposes the portion of the fuse layer outside of the fuse region; and
    using the second patterned photoresist layer as an etch mask to etch each of the fuse layer, the protective layer, and the high-K dielectric layer until the second surface portion of the STI structure outside of the fuse region is exposed.

3. The method of claim 2, wherein:
    one of the first patterned photoresist layer and the second patterned photoresist layer is made of a positive photoresist material and the other of the first patterned photoresist layer and the second patterned photoresist layer is made of a negative photoresist material; and
    the first patterned photoresist layer and the second patterned photoresist layer are formed using a same photo mask for an exposure process of a corresponding photoresist material.

4. The method of claim 1, further including:
    forming a transistor on a surface of the semiconductor substrate while simultaneously forming the fuse structure, wherein the transistor includes a gate dielectric layer including the high-K dielectric layer, and a gate electrode layer including a metal.

5. The method of claim 4, wherein the forming of the transistor includes:
    forming a third patterned photoresist layer on a portion of the fuse layer on the semiconductor substrate, before the second surface portion of the STI structure outside of the fuse region is exposed; and using the third patterned photoresist layer as an etch mask to remove a corresponding portion of each layer of the fuse layer, the protective layer, and the high-K dielectric layer to expose the semiconductor substrate to form a dummy gate structure, while simultaneously removing each of the portion of the fuse layer, the remaining portion of the protective layer, and the remaining portion of the high-K dielectric layer to expose the second surface portion of the STI structure outside of the fuse region, wherein the dummy gate structure includes a gate dielectric layer including the etched high-K dielectric layer, and a dummy gate layer including the etched fuse layer.

6. The method of claim 5, further including:

after forming the dummy gate structure, forming an insulating layer on the semiconductor substrate and on sidewalls of the dummy gate structure;

removing the dummy gate layer to form an opening;

filling the opening with the metal to form the gate electrode layer;

removing the insulating layer after the gate electrode layer is formed;

forming sidewall spacers on the semiconductor substrate and on sidewalls of the gate electrode layer; and forming a source region and a drain region in the semiconductor substrate on both sides of the gate electrode layer or the sidewall spacers.

7. The method of claim 1, wherein the fuse layer is made of polycrystalline silicon or polycrystalline germanium, and the protective layer is made of titanium nitride, tantalum nitride, or a combination thereof.

8. The method of claim 1, further including doping the fuse layer with p-type ions or n-type ions using a process including an in-situ doping process or an ion implantation process, wherein the fuse layer is polycrystalline silicon.

9. The method of claim 1, wherein the STI structure is made of a material including silicon oxide.

10. The method of claim 1, wherein each of the protective layer, the high-K dielectric layer, and the fuse layer is formed by a process including a chemical vapor deposition process or a physical vapor deposition.

11. The method of claim 1, wherein, after the second surface portion of the STI structure outside of the fuse region is exposed, the fuse structure includes:

a cathode at one end and an anode at another end of a remaining portion of the fuse layer, and a blowing area formed between the cathode and the anode.

12. The method of claim 11, wherein the blowing area has a width less than each of the cathode and the anode.

13. The method of claim 11, further including:

forming a plurality of conductive plugs on a surface of each of the cathode and the anode, wherein the plurality of conductive plugs are made of a material including copper, tungsten, aluminum, or a combination thereof.

* * * * *